United States Patent
Lu

(10) Patent No.: US 10,361,316 B2
(45) Date of Patent: Jul. 23, 2019

(54) LOW TEMPERATURE POLY-SILICON THIN FILM TRANSISTOR AND METHOD FOR MANUFACTURING THE SAME

(71) Applicant: Shenzhen China Star Optoelectronics Technology Co., Ltd., Shenzhen, Guangdong (CN)

(72) Inventor: Changming Lu, Guangdong (CN)

(73) Assignee: Shenzhen China Star Optoelectronics Technology Co., Ltd, Shenzhen, Guangdong (CN)

( * ) Notice: Subject to any disclaimer, the term of this patent is extended or adjusted under 35 U.S.C. 154(b) by 0 days.

(21) Appl. No.: 15/845,220

(22) Filed: Dec. 18, 2017

(65) Prior Publication Data

US 2018/0108784 A1 Apr. 19, 2018

Related U.S. Application Data

(62) Division of application No. 14/437,822, filed on Apr. 22, 2015.

(51) Int. Cl.
| | |
|---|---|
| H01L 29/06 | (2006.01) |
| H01L 29/786 | (2006.01) |
| H01L 21/027 | (2006.01) |
| H01L 21/311 | (2006.01) |
| H01L 29/417 | (2006.01) |
| H01L 29/66 | (2006.01) |
| H01L 29/78 | (2006.01) |

(52) U.S. Cl.
CPC .... *H01L 29/78675* (2013.01); *H01L 21/0273* (2013.01); *H01L 21/31144* (2013.01); *H01L 29/06* (2013.01); *H01L 29/41733* (2013.01); *H01L 29/66757* (2013.01); *H01L 29/786* (2013.01); *H01L 29/7833* (2013.01); *H01L 29/78621* (2013.01)

(58) Field of Classification Search
CPC ....... H01L 29/78675; H01L 21/027033; H01L 29/7833
USPC .................................................. 257/59, 347
See application file for complete search history.

(56) References Cited

U.S. PATENT DOCUMENTS

| | | | | |
|---|---|---|---|---|
| 7,598,512 B2 * | 10/2009 | Chen | ............ | H01L 27/2436 257/2 |
| 7,646,442 B2 * | 1/2010 | Yang | ............ | G02F 1/1368 257/59 |
| 9,385,195 B1 * | 7/2016 | Zhang | ............ | H01L 29/1033 |
| 9,653,585 B2 * | 5/2017 | Zhang | ............ | H01L 29/1033 |
| 2008/0135845 A1 * | 6/2008 | Heo | ............ | H01L 27/1288 257/59 |
| 2010/0308333 A1 * | 12/2010 | Yoo | ............ | H01L 27/1214 257/59 |
| 2011/0114955 A1 * | 5/2011 | Chun | ............ | G02F 1/136213 257/59 |
| 2011/0175088 A1 * | 7/2011 | Kim | ............ | H01L 27/1225 257/57 |

(Continued)

*Primary Examiner* — Long K Tran
(74) *Attorney, Agent, or Firm* — Andrew C. Cheng

(57) ABSTRACT

A low temperature poly-silicon thin film transistor includes at least an interlayer dielectric layer formed of a material including silicon oxide and silicon nitride, in such a way that the interlayer dielectric layer includes a depression region channel in a stepped form. A source metal layer and a drain metal layer are formed in the depression region channel in the stepped form.

6 Claims, 4 Drawing Sheets

(56) References Cited

U.S. PATENT DOCUMENTS

2014/0054584 A1\* 2/2014 Sunannura ............ H01L 27/092
                                                      257/43
2014/0077207 A1\* 3/2014 Gao ..................... G02F 1/1368
                                                      257/43

\* cited by examiner

LOW TEMPERATURE POLY-SILICON THIN FILM TRANSISTOR AND METHOD FOR MANUFACTURING THE SAME

CROSS REFERENCE TO RELATED APPLICATIONS

This is a divisional application of patent application Ser. No. 14/437,822, filed on Apr. 22, 2015, which is a national stage of PCT Application Number PCT/CN2015/070419, filed on Jan. 9, 2015, claiming foreign priority of Chinese Patent Application Number 201410856397.4, filed on Dec. 31, 2014.

BACKGROUND

1. Technical Field

The disclosure is related to the thin film transistor field, and more particular to a low temperature poly-silicon thin film transistor and a method for manufacturing a low temperature poly-silicon thin film transistor.

2. Related Art

Refer to FIG. 1. FIG. 1 is the schematic structure of the low temperature poly-silicon thin Film transistor of the prior art.

As shown in FIG. 1, the low temperature poly-silicon thin Film transistor of the prior art comprises sequentially a substrate, a SiNx layer, a SiOx substrate layer an a-Si layer, a doped region doped with different doses of P31 (phosphorus having relative molecular mass of 31), a GE layer (gate metal layer), a source (source metal) layer, and a drain (drain metal) layer. The source metal layer and the drain metal layer are correspondingly formed in the depression region channel as indicated by the ILD Via Hole arrow shown in FIG. 1 and connect with the doped region.

It can be seen from FIG. 1 that the vertical hole configuration for the depression region has greater affection on the source metal layer and the drain metal layer. For example, with increase of the film thickness of the ILD (interlayer dielectric layer), the line width of the source metal layer and the drain metal layer become narrow. The troubles in the process gradually emerge. In particular, for the super-resolution LTPS and the final products, the line may possibly break for the source metal layer and the drain metal layer formed in the depression region channel ILD via Hole, such as contact with the edges and corners of the depression region channel ILD via Hole. Secondly, the source metal layer and the drain metal layer may not completely fill the depression region channel ILD via Hole such that small gaps are formed. Thus it is easy to decrease the reliability of the product. The yield rate and the pass rate cannot be guaranteed either.

SUMMARY

The disclosure provides a low temperature poly-silicon thin film transistor and a method for manufacturing the same to solve the technical problems of the line break of the source metal layer and the drain metal layer and the low product reliability.

In order to solve the above technical problems, the disclosure provides a method for manufacturing a low temperature poly-silicon thin film transistor, comprising forming an interlayer dielectric layer by adopting a material comprising silicon oxide and silicon nitride on a gate metal layer; forming a photoresist layer on the interlayer dielectric layer, and conducting a first photoresist removing on the photoresist layer to expose the interlayer dielectric layer with a first area; etching the interlayer dielectric layer with the first area to form a first depression region; conducting a second photoresist removing on the photoresist layer to expose the interlayer dielectric layer with a second area, wherein the first depression region is in the interlayer dielectric layer with the second area; etching the interlayer dielectric layer with the second area and the first depression region to form a second depression region in a stepped from at the periphery of the first depression region.

In one embodiment, after the step of etching the interlayer dielectric layer with the second area and the first depression region to form a stepped second depression region at the periphery of the first depression region, further comprises a step of conducting a plurality of times of photoresist removing on the photoresist layer to successively expose the interlayer dielectric layer with a plurality of areas, and successively etching the corresponding interlayer dielectric layer with the plurality of areas to form a depression region channel in a multi-stepped form.

In one embodiment, after the step of forming the depression region channel in the multi-stepped form further comprising respectively forming a source metal layer or a drain metal layer in the depression region channel.

In one embodiment, the photoresist removing is conducted by adopting the dry etching and the plasma approach for 10 to 500 seconds under the condition of the radio frequency power of 200 to 3000 KHz.

In one embodiment, the gas used in the process of the plasma approach is oxygen, carbon tetrafluoride, or nitrogen oxides, the radio frequency power is 1000 to 2000 KHz, and the processing time is 200 to 300 seconds.

In one embodiment, when the full dry etching and the oxygen plasma approach are conducted for the photoresist removing, the etching recipe of high selectivity ratio between polysilicon and silicon oxide film or between polysilicon and silicon nitride film is used to form the depression region channel.

In order to solve the above problems, the embodiment of the disclosure further provides an interlayer dielectric layer formed by adopting a material comprising silicon oxide and silicon nitride, wherein the interlayer dielectric layer is formed with a depression region channel in a stepped form; and a source metal layer and a drain metal layer, formed in the depression region channel in the stepped form.

In one embodiment, the depression region channel is in an at least three-stepped form.

In one embodiment, the depression region channel is in a four-stepped form.

Through the above technical solutions, the advantageous effects of the embodiments of the present disclosure are as follow. The embodiments of the disclosure configure the stepped depression region channel in the interlayer dielectric layer such that the problem of the line break due to contact with the edges and corners of the depression region channel may be prevented when the source metal layer and the drain metal layer are manufactured in the depression region channel. The technical problem of the low product reliability caused by the gap formed due to that the source metal layer and the drain metal layer may not completely fill the depression region channel may also be prevented. Further, the problem of the line break due to the increase of the film thickness of the interlayer dielectric layer may be prevented.

In the meanwhile, the reliability, the yield rate and the pass rate of the products are increased.

BRIEF DESCRIPTION OF THE DRAWINGS

In order to explain the technical solutions of the disclosure more clearly, the brief description of the drawings for explanation of the embodiments is given as below. Apparently, the following drawings are merely some embodiments of the disclosure. For those skilled in the art, the other drawings are attainable without creative endeavor according to these drawings, wherein.

DETAILED DESCRIPTION

The following description with reference to the accompanying drawings is provided to clearly and completely explain the exemplary embodiments of the disclosure. It is apparent that the following embodiments are merely some embodiments of the disclosure rather than all embodiments of the disclosure. According to the embodiments in the disclosure, all the other embodiments attainable by those skilled in the art without creative endeavor belong to the protection scope of the disclosure.

Figure 1:
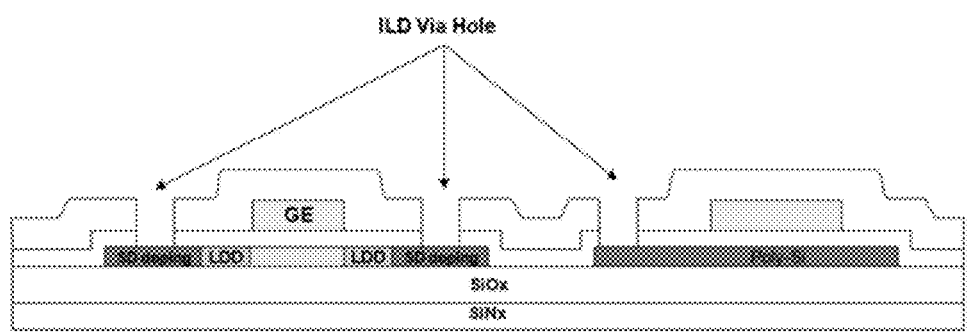
FIG. 1 is the schematic structure of the Low temperature poly-silicon thin Film transistor of the prior art.
Figure 2:
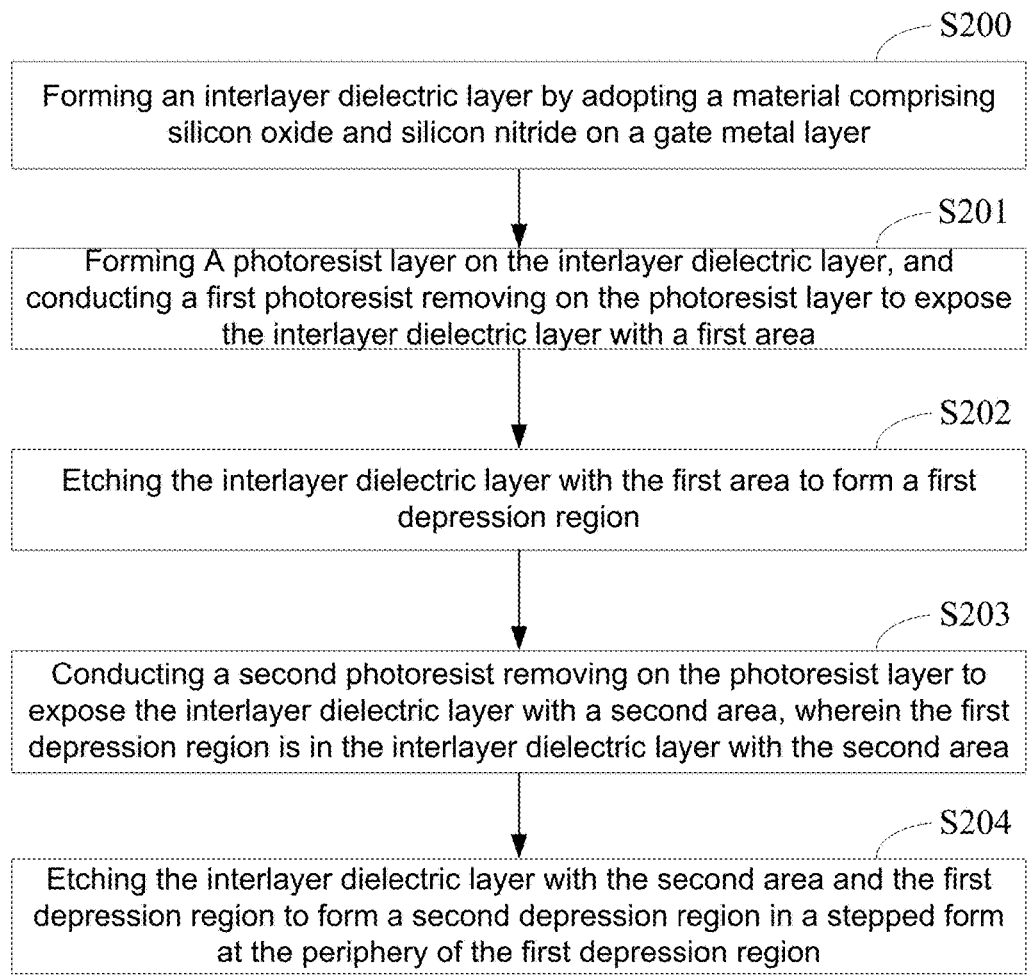
FIG. 2 is the schematic flow chart for the method of manufacturing the Low temperature poly-silicon thin Film transistor according to the disclosure.
Figure 3A:
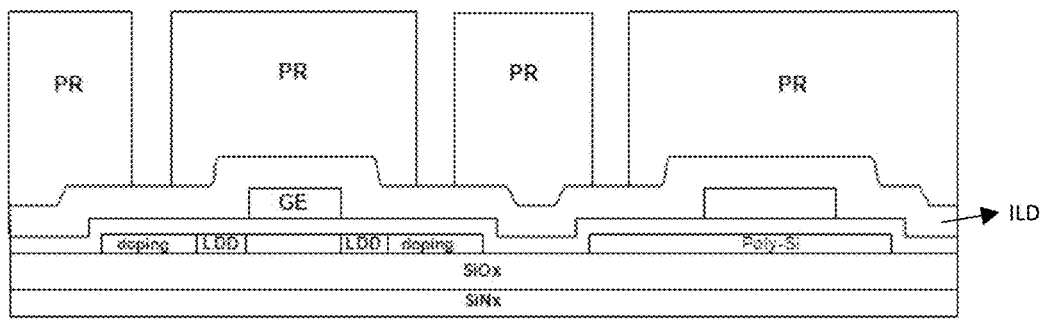
FIG. 3A to 3E are the schematic diagrams for the manufacturing method shown in FIG. 2.
Figure 3B:
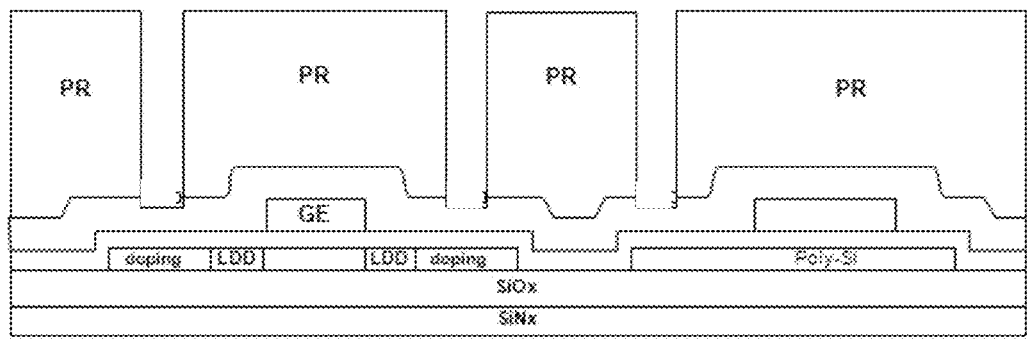
Figure 3C:
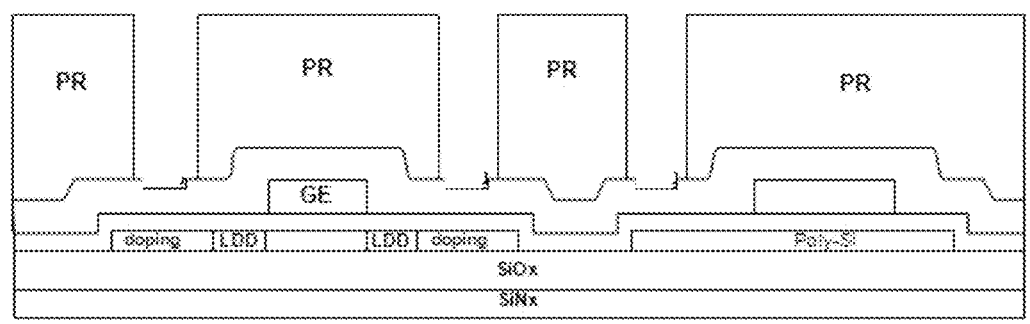
Figure 3D:
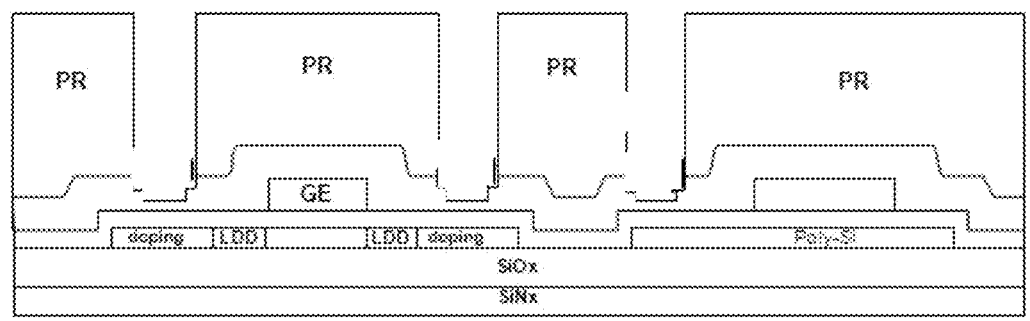
Figure 3E:
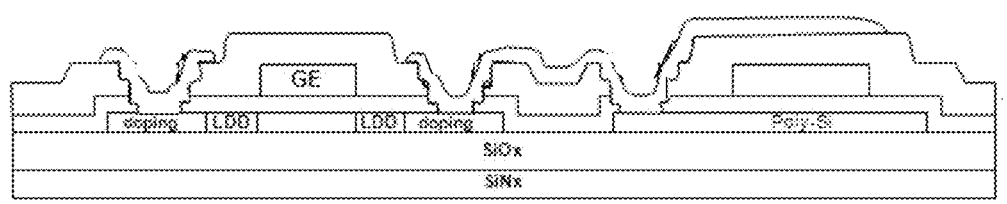

Refer to FIG. 2 to FIG. 3E. FIG. 2 is the schematic flow chart for the method of manufacturing the low temperature poly-silicon thin film transistor according to one embodiment of the disclosure. The method of manufacturing the Low temperature poly-silicon thin Film transistor comprises but does not limit to the following steps.

Step 200: an interlayer dielectric layer is formed by adopting a material comprising silicon oxide and silicon nitride on a gate metal layer.

In step 200, the chemical formula of silicon oxide is $SiO_x$. The chemical formula of silicon nitride is $SiN_x$. The interlayer dielectric layer is the interlayer dielectric layer ILD as shown in FIG. 3A.

Step S201: a photoresist layer is formed on the interlayer dielectric layer, and conducting a first photoresist removing on the photoresist layer to expose the interlayer dielectric layer with a first area.

In step S201, the photoresist layer is the photoresist layer PR as shown in FIG. 3A. In FIG. 3A, the photoresist removing may be conducted by the patterning process to form a plurality of etching channels between the photoresist layers PR. The first area is the same as that of the cross-section of the etching channels.

Step S202: the interlayer dielectric layer with the first area is etched to form a first depression region 31.

In step S202, as shown in FIG. 3B, after etching, the first depression region is formed on the interlayer dielectric layer. The area of the first depression region is the same as the first area.

Step S203: a second photoresist removing is conducted on the photoresist layer to expose the interlayer dielectric layer with a second area, wherein the first depression region is in the interlayer dielectric layer with the second area.

In step S203, as shown in FIG. 3C, by way of conducting the second photoresist removing on PR, the interlayer dielectric layer with the second area covered by PR as shown in FIG. 3B is exposed. The first area, the second area and the area of the cross-section of the etching channel formed currently are the same.

Step S204: the interlayer dielectric layer with the second area and the first depression region are etched to form a second depression region 32 in a stepped from at the periphery of the first depression region.

In step S204, as shown in FIG. 3D, because the first depression region and the exposed interlayer dielectric layer with the second area are etched simultaneously, the etched thickness for both is substantially the same such that the uniform steps with similar height are formed.

After the step S204, the embodiment of the disclosure further comprises a step of photoresist removing process to form the structure as shown in FIG. 3E.

It should be noted that after the step of etching the interlayer dielectric layer with the second area and the first depression region to form a second depression region in a stepped from at the periphery of the first depression region, the embodiment further comprises a step of conducting a plurality of times of photoresist removing on the photoresist layer to successively expose the interlayer dielectric layer with a plurality of areas, and successively etching the corresponding interlayer dielectric layer with the plurality of areas to form a depression region channel in a multi-stepped form 33. In other words, the embodiment of the disclosure may repeat the above steps to form a depression region channel having a three-layered step, a four-layered step or more-layered step. The number of the step may be determined specifically according to the thickness of the interlayer dielectric layer ILD.

Furthermore, after the step of forming the depression region channel, the embodiment may further comprise a step of forming a corresponding source metal layer and a corresponding drain metal layer respectively in the depression region channel. As shown in FIG. 3E, the disposition structure is formed in the above depression region channel.

It should be noted that when conducting the photoresist removing, the embodiment adopts the dry etching and the plasma approach to conduct the photoresist removing for 10 to 500 seconds under the condition of the radio frequency power of 200 to 3000 KHz. Specifically, the gas used in the process of the plasma approach is oxygen, carbon tetrafluoride, or nitrogen oxides, the radio frequency power is 1000 to 2000 KHz, and the processing time is 200 to 300 seconds. It is not restricted within the scope that those skilled in the art may easily appreciate. In one embodiment, the photoresist removing is conducted repeatedly for 250 seconds under the condition of the radio frequency power of 1800 KHz.

It is apparent in the other embodiments that when the full dry etching and the oxygen plasma approach are conducted for the photoresist removing, the disclosure may use the etching recipe of high selectivity ratio between polysilicon and silicon oxide film or between polysilicon and silicon nitride film to form the depression region channel.

In other embodiments, when the dry and wet etching are used to conduct the photoresist removing, the disclosure may adopt buffered hydrofluoric acid (BHF) etchant or hydrofluoric acid (HF) etchant to form the depression region channel.

It is noted that the embodiment of the disclosure may further adopt half tone mask or gray tone process for the patterning process. In the corresponding process of photoresist removing, the full dry etching and the oxygen plasma approach may be adopted for repeat photoresist removing.

The embodiments of the disclosure configure the depression region channel in a stepped form in the interlayer dielectric layer such that the problem of the line break due to contact with the edges and corners of the depression region channel may be prevented when the source metal layer and the drain metal layer are manufactured in the depression region channel. The technical problem of the low product reliability caused by the gap formed due to that the source metal layer and the drain metal layer may not completely fill the depression region channel may also be prevented. Further, the problem of the line break due to the increase of the film thickness of the interlayer dielectric layer may be prevented. In the meanwhile, the reliability, the yield rate and the pass rate of the products are increased.

Figure 4:
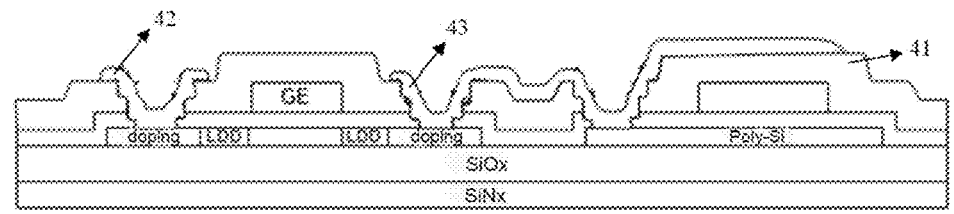
FIG. 4 is the schematic structure of the Low temperature poly-silicon thin Film transistor according to another embodiment of the disclosure.

Refer to FIG. 4. FIG. 4 is the schematic structure of the low temperature poly-silicon thin film transistor according to another embodiment of the disclosure. The low temperature poly-silicon thin film transistor of the embodiment comprises an interlayer dielectric layer 41, a source metal layer 42 and a drain metal layer 43. The interlayer dielectric layer 41 is formed with the depression region channel in a stepped form, the depression region channel is a hole including a first sidewall and a second sidewall opposite to the first sidewall, the first sidewall is uneven so that a plurality of first steps are located in the hole, and the second sidewall is uneven so that a plurality of second steps are located in the hole. The interlayer dielectric layer 41 defines at least two holes, the source metal layer 42 is located in one hole, and the drain metal layer 43 is located in another hole.

The interlayer dielectric layer is formed by adopting a material comprising silicon oxide and silicon nitride. The interlayer dielectric layer is formed with a depression region channel in a stepped form. The source metal layer 42 and the drain metal layer 43 are respectively formed in the depression region channel in the stepped form.

It is noted that the depression region channel in this embodiment is in an at least three-stepped form. In one embodiment, the depression region channel is in a four-stepped form.

Furthermore, it may be seen from FIG. 4 that the Low temperature poly-silicon thin Film transistor of the embodiment may further comprises a gate metal layer GE, a doped region doping, a light doped region LDD and a substrate layer formed by a material comprising silicon oxide and silicon nitride. The description is not repeated within the scope that those skilled in the art may easily understand.

It is noted that the low temperature poly-silicon thin film transistor of the embodiment may be formed by the embodiments as stated above. It is not restricted herein.

The embodiments of the disclosure configure the depression region channel in the stepped from in the interlayer dielectric layer 41 such that the problem of the line break due to contact with the edges and corners of the depression region channel may be prevented when the source metal layer 42 and the drain metal layer 43 are manufactured in the depression region channel. The technical problem of the low product reliability caused by the gap formed due to that the source metal layer 42 and the drain metal layer 43 may not completely fill the depression region channel may also be prevented. Further, the problem of the line break due to the increase of the film thickness of the interlayer dielectric layer 41 may be prevented. In the meanwhile, the reliability, the yield rate and the pass rate of the products are increased.

Note that the specifications relating to the above embodiments should be construed as exemplary rather than as limitative of the present disclosure. The equivalent variations and modifications on the structures or the process by reference to the specification and the drawings of the disclosure, for example the combination of the technical features in each embodiment, and application to the other relevant technology fields directly or indirectly should be construed similarly as falling within the protection scope of the disclosure.

What is claimed is:

1. A low temperature poly-silicon thin film transistor, comprising:
an interlayer dielectric layer formed of a material comprising silicon oxide and silicon nitride, wherein the interlayer dielectric layer is formed with a depression region channel in a stepped form, the depression region channel is a hole comprising a first sidewall and a second sidewall opposite to the first sidewall, the first sidewall is uneven so that a plurality of first steps are located in the hole, and the second sidewall is uneven so that a plurality of second steps are located in the hole; and
a source metal layer and a drain metal layer, formed in the depression region channel in the stepped form.

2. The low temperature poly-silicon thin film transistor according to claim 1, wherein the depression region channel is in an at least three-stepped form.

3. The low temperature poly-silicon thin film transistor according to claim 1, wherein the depression region channel is in a four-stepped form.

4. A low temperature poly-silicon thin film transistor, comprising:
an interlayer dielectric layer formed of a material comprising silicon oxide and silicon nitride, wherein the interlayer dielectric layer defines a first hole and a second hole spaced apart from each other, each of the first hole and the second hole comprises a first sidewall and a second sidewall opposite to the first sidewall, the first sidewall is uneven so that a plurality of first steps are located in the hole, and the second sidewall is uneven so that a plurality of second steps are located in the hole;
a source metal layer located in the first hole; and
a drain metal layer located in the second hole.

5. The low temperature poly-silicon thin film transistor according to claim 4, wherein the number of the plurality of first steps is three, and the number of the plurality of second steps is three.

6. The low temperature poly-silicon thin film transistor according to claim 4, wherein the number of the plurality of first steps is four, and the number of the plurality of second steps is four.

* * * * *